United States Patent [19]

Spaanenburg et al.

[11] Patent Number: 4,656,592
[45] Date of Patent: Apr. 7, 1987

[54] VERY LARGE SCALE INTEGRATED CIRCUIT SUBDIVIDED INTO ISOCHRONOUS REGIONS, METHOD FOR THE MACHINE-AIDED DESIGN OF SUCH A CIRCUIT, AND METHOD FOR THE MACHINE-AIDED TESTING OF SUCH A CIRCUIT

[75] Inventors: Lambertus Spaanenburg, Hengelo; Peter B. Duin, Nijmegen; Roberto Woudsma, Eindhoven; Arie A. van der Poel, Enschede, all of Netherlands

[73] Assignee: U.S. Philips Corporation, New York, N.Y.

[21] Appl. No.: 659,395

[22] Filed: Oct. 10, 1984

[30] Foreign Application Priority Data

Oct. 14, 1983 [NL] Netherlands .................. 8303536

[51] Int. Cl.[4] .................. G06F 1/00; G06F 13/00; G06F 15/60
[52] U.S. Cl. .................................. 364/490; 364/200
[58] Field of Search .............. 364/490, 491, 579, 580, 364/200 MS File, 900 MS File; 371/16; 307/303; 357/45

[56] References Cited

U.S. PATENT DOCUMENTS

| | | | |
|---|---|---|---|
| 3,896,418 | 4/1975 | Brown | 364/200 |
| 3,919,695 | 11/1975 | Gooding | 364/200 |
| 4,065,809 | 12/1977 | Matsumoto | 364/200 |
| 4,130,865 | 12/1978 | Heart et al. | 364/200 |
| 4,174,514 | 11/1979 | Sternberg | 340/146.3 MA |
| 4,191,996 | 3/1980 | Chesley | 364/200 |
| 4,251,861 | 2/1981 | Mago | 364/200 |
| 4,270,169 | 5/1981 | Hunt et al. | 364/200 |
| 4,270,170 | 5/1981 | Reddaway | 364/200 |
| 4,366,535 | 12/1982 | Cedolin et al. | 364/200 |
| 4,397,021 | 8/1983 | Lloyd et al. | 371/20 |
| 4,402,045 | 8/1983 | Krol | 364/200 |
| 4,445,171 | 4/1984 | Neches | 364/200 |
| 4,466,063 | 8/1984 | Segarra et al. | 364/200 |
| 4,468,727 | 8/1984 | Carrison et al. | 364/200 |
| 4,471,483 | 9/1984 | Chamberlain | 371/21 |
| 4,484,292 | 11/1984 | Hong et al. | 364/491 |
| 4,489,397 | 12/1984 | Lee | 364/900 |
| 4,517,659 | 5/1985 | Chamberlain | 364/900 |

OTHER PUBLICATIONS

Trimberger, Stephen, "Automating Chip Layout," *IEEE Spectrum,* Jun. 1982, vol. 19, No. 6, pp. 38–45.
Daniel et al., "CAD Systems for IC Design", *IEEE Trans. on Computer Aided Design of Integrated Circuits and Systems,* Jan. 1982, vol. CAD-1, No. 1, pp. 2–12. 44

*Primary Examiner*—Felix D. Gruber
*Assistant Examiner*—Daniel W. Juffernbruch
*Attorney, Agent, or Firm*—Jack E. Haken; James J. Cannon, Jr.

[57] ABSTRACT

A very large scale integrated circuit comprises a number of function blocks which are synchronized by relevant clock signals. Each function block forms an isochronous region so that the delay times of the signals within the relevant function block can be negligibly small with respect to the gate delay times. Each function block is paired with at least one other function block in that the pair is connected by an information connection and by at least two synchronization handshake lines for transporting synchronization signals dispatched by each function block of the pair to the other function block of the pair so that an asynchronous information transport is obtained. One or more of the function blocks comprises an information connection to the environment. As a result of this set-up, the circuit can also be tested and designed per function block.

16 Claims, 18 Drawing Figures

VERY LARGE SCALE INTEGRATED CIRCUIT SUBDIVIDED INTO ISOCHRONOUS REGIONS, METHOD FOR THE MACHINE-AIDED DESIGN OF SUCH A CIRCUIT, AND METHOD FOR THE MACHINE-AIDED TESTING OF SUCH A CIRCUIT

BACKGROUND OF THE INVENTION

This invention relates to a very large scale integrated circuit (VLSI) which comprises a number of function cells which are connected to one another and to the environment by means of information connections.

Chapter 7 (by C. L. Seitz) of Mead & Conway's book, Introduction to VLSI systems, Addison-Wesley, Philippine Copyright 1980, describes the problems relating to the mutual synchronization of various elements of the circuit. These problems increase as the technology develops towards very large scale integration (VLSI), because the switching times of active elements (gates, transistors) decrease rapidly as their dimensions decrease, while the transport times of information signals via connections between these active elements decrease less rapidly. Furthermore, the number of active elements on one chip continually increases, so that the physical dimensions of the circuits are not reduced systematically. Consequently comparatively speaking, the maximum signal transport time across the circuit remains the same over the years. The duration of signal transports between neighboring circuit elements is usually not objectionable, but the requirement that an arbitrary transport within the circuit must be performed sufficiently quickly either imposes an upper limit on the feasible operating speed, for example as defined by a clock frequency, or imposes a set of restrictive and sometimes contradictory restrictions on the relative positions of various active elements, because the elements which communicate with one another may not be situated too far apare in a synchronous system.

The latter implies an increasing complexity of the design methodology of very large scale integrated circuits. Another problem, caused by the increasing number of switching elements (gate equivalents) on a chip, is the complexity of the necessary test procedures. For circuits which are not excessively large an attractive method has been proposed by Eichelberger (U.S. Pat. No. 3,761,695), but the complexity of this test method also increases rapidly, because each bistable element of the circuit must receive an information bit. In the case of a large number of such bistable elements, the length of the test patterns (bit series) and notably the length of the series of test patterns becomes too large to allow for complete testing within a limited period of time. It is to be noted that such a test may be performed on the physical circuit itself as well as on a simulated circuit which is stored in a computer memory in the form of interaction structures. Finally, the design of such a very large scale integrated circuit becomes increasingly more complex, as will be described hereinafter.

SUMMARY OF THE INVENTION

It is an object of the invention to mitigate the restrictions as regards the design in order to enable a structured design procedure and also to improve the testability of such a circuit or to facilitate the design thereof by dividing the circuit into so-called isochronous regions. This object is achieved in accordance with the invention in that said function cells are grouped in a number of $m \geq 3$ function blocks. The integrated circuit which is accommodated on a single chip is subdivided into m isochronous regions, each of which comprises one function block. Each isochronous region comprises a communication cell for each information connection between a function cell which is situated within the relevant isochronous region and any function cell which is situated outside said isochronous region. Said communication cell is connected in the relevant information connection so that the information connection between two function cells which are situated in different isochronous regions always comprises a pair-wise series connection of communication cells. Two communication cells thus paired are always interconnected by an information connection and at least two synchronization (handshake) connections in order to realize, using bidirectional synchronization handshake signals, as asynchronous information transport between said paired communication cells. Each information connection from any function cell to the environment comprises a further communication cell for the exchange of information and synchronization signals with the environment. The function cells within a function block form a coherent first network while the function blocks within the integrated circuit form a coherent second network. An isochronous region is to be understood to mean herein a part of the circuit in which delay times of the signals on the lines are negligibly small, which means that a differential variation of this delay time cannot modify the logic behavior of the circuit. In a synchronously operating circuit, therefore, these delay times are negligibly small with respect to the synchronization period. The exact definition of "negligibly small" depends on the structure of the clock pulse cycle (one, two or more level transitions per clock cycle). In an asynchronously operating circuit, the delay time should thus be small with respect to the switching times of the logic elements. The most unfavorable situations are then determining, because the switching times may depend notably on the supply voltage and the ambient temperature and the delay times do not vary or vary only little as a function of these parameters. A given amount of chip area is required for the realization of the communication cells for each isochronous region. Therefore, the size of such an isochronous region should not be too small. On the other hand, it may not be excessively large because the requirement "isochronous region" will then necessitate a reduction of the operating frequency or will lead to the severe requirements as regards relative positions within the relevant isochronous region or will complicate the design/testing of the function block within an isochronous region.

It would be obvious that the principal problem thus solved is the timing problem: delays between respective function blocks will not cause malfunction, but only delay the correct execution of the function and only in such amount as caused by the instantaneous delay interval. If no transfer is effected the delay interval is nonexistent. Furthermore, the delay is determined at the lowest level, and is unrelated to intervals due to a higher level of operation, such as computer cycle times and the like. The fact that the communication between respective function blocks is controlled on the level of the function blocks themselves, i.e. in a decentralized manner, allows for uncomplicated control and uncomplicated hardware provisions to this effect. Thus, also the necessary area for these communication cells is quite small. Notably, no centralized communication control means or even a special on-chip communication processor with all related complication of design, wiring and interfacing would be required according to the invention. Also, the execution of the communication under distributed control allows for limiting the information path width to that strictly necessary. This may lead to different information path widths between respective function blocks. A memory block would need to be connected for communicating both data and addresses, and only little control. A register stack or FIFO could do without long memory addresses. Certain function blocks could communicate data in serial form, while others must communicate the data in parallel form.

A function cell is to be understood to mean herein an arrangement of active elements which at least substantially completely occupy a finite region on the chip.

Data, address or control information is processed or stored in such a function cell. A function block may be formed from one or more function cells which may be of a completely different nature. Often function blocks are chosen so that they all have approximately the same size but this is not a necessary restriction. The function cells within any single function block and also the function blocks within an integrated circuit form a coherent network; this coherence necessitates the addition of the communication cells between the function blocks, no (further) communication cells being required within a single function block.

The information connection between two paired communication cells may comprise data lines, address lines or control lines. These lines may in principle be conductive in one direction or in two directions. A single line may in principle be capable of coupling more than two communication cells, for example in the way of a star connection, a bus connection or in another way. Usually the relevant synchronization handshake mechanism must then be extended, but such extensions are known per se, for example by using three synchronization lines instead of two. Generally, a pair of communication cells may also be connected by way of three or more synchronization lines.

The processing operation of the complete circuit may be synchronous, using an external or internal clock, or asynchronous, or a mixture thereof. The communication between communication cells, however, is always asynchronous. The effect of synchronizing signals received from the environment is always unconditional within an isochronous region; delays of signals within the relevant isochronous region do not influence the effect of the synchronizing signals. Delay of a signal is to be understood to mean herein a delay time through elements of a circuit which itself cannot be influenced by a synchronizing signal, such as a delay by a line, by a capacitance or inductance and the like. The hold time of a storage element which is controlled by a clock cycle, for example a shift register element or a series of shift register elements, therefore, is not covered by this definition. This is because such a hold time may last for an indefinite period of time when the clock signals are interrupted. Consequently, an isochronous region is a region in which the applied synchronizing signals have an uncondition effect. Known integrated circuits, therefore, consist of a single isochronous region according to the above definition. A cycle of clock signals may consist of a single clock pulse or of a series of clock pulses; the latter is known, for example from multi-phase dynamic MOS logic (for example, by way of successive precharge and sample clock pulses). The condition of mutual isochronism need not be satisfied between two paired isochronous regions: depending on the instantaneous situation (information content of the relevant isochronous regions, physical circumstances, clock frequency if the latter is in principle adaptable, for example to the supply voltage), the relevant isochronous regions may have to wait for one another or not. The synchronization handshake can be realized in various ways, for example by means of bit-wise request/acknowledge signals. Alternatively, the protocol may be on a higher level, for example in that request and/or acknowledge signals are needed only before/after a series of bit intervals.

Preferably, at least two function blocks which are paired by way of intermediate communication cells both comprise processing function cells. These processing function blocks can thus quickly communicate without requiring an intermediate memory. A processing function block is to be understood to mean herein a function block whose primary function is the execution of operations on information in order to modify the information format or content. Examples in this respect are: general purpose processors and special purpose processors such as input/output, coding/decoding and control processors. Categories of function blocks other than processing function blocks are memory function blocks (read/write, read-only or intermediate types such as PROM, EAROM and the like; the organization thereof may imply random accessibility, matrix-organization, but it may also be serial such as in a shift regiseter), information distributors such as (de)-multiplexers and others. A function block may thus comprise one or more function cells.

Preferably, the information connection between an isochronous region and further function blocks comprises a register bank which can be selectively coupled to said further function blocks under the control of relevant control blocks. This results in a building block which can be advantageously used in large circuits.

Preferably, at least three function cells which are situated in a corresponding number of mutually paired isochronous regions are connected by means of communication cells with intermediate information lines which are unidirectionally conductive in a direction from the directly preceding isochronous region to the directly subsequent isochronous region. Optimum use is thus made of the processing speed of the elements of the pipeline structure. The integrated circuit may also form a microprocessor which comprises at least a function block (ALU) which performs arithmetic and logic functions, a memory function block and an input/output function block which comprises an information connection to the environment. This results in an attractive building block which comprises notably at least three different types of function blocks.

FURTHER ASPECTS OF THE INVENTION

Preferably, at least one isochronous region comprises means for supplying a test pattern or result pattern received from another isochronous region bit-by-bit to a third isochronous region when the integrated circuit is in a test state. By passing the information-modifying structure of the various function blocks, a test pattern can thus be directly applied to the function block to be tested or the result pattern can be directly outputted. For testing, the function blocks are thus isolated. Furthermore, the interactions between the various function blocks need not be tested because they are asynchronous so that they can never cause an incorrect interaction between different isochronous regions. This is because absolute correctness is obtained while the certainty in the time domain is completely abandoned: it is in principle completely unpredictable at which instant another communication cell will supply the asynchronous synchronizing handshake signal. The general processing speed in an integrated circuit of the described kind may significantly vary as a function of the relative positions of the various function blocks. Two closely cooperating function blocks such as an ALU and the associated control ROM, should then be positioned near one another. However, a control unit for a serial input-/output connection can be positioned anywhere on the chip.

Preferably, said group forms a chain of function blocks for supplying test patterns to the function block to be tested or for outputting result patterns from the function block to be tested in that each isochronous region whose function block is included in the chain comprises communication cells which are included in the chain which, therefore, comprises at least two communication cells, each of said communication cells having alternatively activated first and second states, for activating the associated function block in a first state and in a second state supplying a test pattern or result pattern received from a second isochronous region bit-by-bit to a third isochronous region. The input/output of test patterns or test results can be realized via the customary connection to the environment, but also via a separate test pin.

Preferably, at least one isochronous region comprises information connection means for communicating, in a test state of the integrated circuit, a result pattern of a test to a test circuit, said isochronous region otherwise comprising exclusively information connections to other isochronous regions. Such information connection means may be a result pattern output line which is common to a plurality of function blocks. The latter idea is based on the assumption that only one of these function blocks can output a result pattern at a time; other function blocks are then in a waiting state. The relevant test circuit can be included in the integrated circuit, or may be formed by a separate device. The relevant test pattern can be internally generated in the relevant function block (self-test) but can also be applied from the environment. This can be done via a common test pattern supply line to which only one active function block is actively connected. Other function blocks are then in a waiting state.

The invention also relates to a method of testing an integrated circuit of the described kind, said method including the steps of:
(a) setting the integrated circuit to a test state;
(b) presenting a test pattern to a function block in order to form a result pattern from said test pattern while excluding therefrom information signals which can be received from other function blocks;
(c) outputting the result pattern of said function block for bit-by-bit presentation to a test circuit;
(d) repeating, if necessary, the steps (b) and (c) while using other test patterns;
(e) verifying the result patterns for correctness until a reliability limit is reached or an error is detected;
(f) repeating, if necessary, the steps (b) to (e) for further function blocks to be tested;
(g) approving the complete integrated circuit on the basis of the reliability limits reached or rejecting the integrated circuit on the basis of the errors detected;
(h) setting the integrated circuit to a ready state in the case of approval.

Thus, a system is formed which exhibits given analogies with said Eichelberger Patent Specification. However, the state of the art serializes bistable elements, followed by filling them with a test pattern after which the processing operation is performed, followed by the serializing of the bistable elements and output of the result pattern. In accordance with the new described method the function blocks are isolated and one or more suitable test patterns are applied to each function block. This can be done simultaneously for several function blocks, but is usually done successively because each time a series of test patterns relating to a given function block is then formed and the associated result patterns are analyzed in succession. The acceleration with respect to the state of the art is substantial. In the case of four function blocks, each having an input and an output having a width of 8 bits, the described distributed method requires only $4 \times 2^8 = 1k$ test patterns for a 100% test. A non-distributed test method would require $2^{32}$ test patterns in order to obtain a 100% test. This number would be too large for economical feasibility. The described isolation can be achieved block by block but also serially, so that all isochronous regions successively receive a respective test pattern and after processing, output the result patterns in succession (serially per bit or per byte).

The invention also relates to method of designing a very large scale integrated circuit of the described type by means of a library of shape elements which define the behavior model of the associated function cells. The method includes the steps of:
(a) describing the group of functions to be performed by the circuit with respect to the environment as a first list of functions which is to be displayed on a display element;
(b) dividing said group into separate function blocks for display on a display element in the form of a second list;
(c) defining a group of $m \geq 3$ isochronous regions, each of which consists of one function block, and also defining the interactions between different function cells in different function blocks in order to add a communication cell to each function cell within a function block having an information connection to a function cell which is situated outside the associated function block, so that each information connection between two function cells which are situated indifferent isochronous regions comprise a series connection of a pair of communication cells, a communication cell comprising a shape element as a connection for an information connection and a synchronization handshake shape element with two synchronization handshake lines;
(d) positioning the function blocks, communication cells, connecting information connections and synchronization handshake connections;
(e) fetching the shape elements defined per function cell from the library.

Usually, a circuit is designed by starting with the smallest shape elements and composng larger shape elements successively therefrom. It is a problem that a composite shape element need not be necessarily correct even when the constituent parts are correct; although the connections will be correct, problems may arise due to the described synchronization difficulties. In accordance with the described method, a reverse approach is used (top down): the whole is split into sub-sets of functions which can be accommodated together in a single isochronous region. In that case no synchronization errors can occur in the mutual coupling of isochronous regions. The positioning within any isochronous region, of course, must still be tested for correctness, but such testing is one degree simpler because of the lower complexity therein. Such circuits consisting of a single isochronous region are known per se, and hence also implicitly the design method. As isochronous region may also be subdivided into isochronous sub-regions which are again paired by means of pairs of communcation cells.

BRIEF DESCRIPTION OF THE FIGURES

The invention will be described in detail hereinafter with reference to some Figures. First some background of the invention will be discussed. Subsequently, a number of embodiments and some attractive synchronization handshake mechanisms will be described.

BACKGROUND AT THE PHYSICAL LEVEL

Some background of the invention at the physical level will first be described. A very large scale integrated circuit comprises a variety of elements such as: transistors, notably switching transistors; capacitance elements, for example designed as MOS capacitors; resistors which can be constructed in various ways; signal connections in metal (for example, aluminum); signal connections in polysilicon, and signal connections produced in the form of a diffusion region. Signal connections of a diffused or polysilicon type are comparatively slow per se, so that metal signal connections are used whenever possible. These metal connections must notably be used for the positive and negative power supply lines; the chip is thus often divided into topological sub-regions which communicate only via polysilicon or diffused lines. Also when the clock signals have to be supplied across large parts of the circuit, they will be carried at least partly in polysilicon connections or in connections formed in a diffused manner. For the latter two techniques the line delay, for example with a line width of 2 microns, is characterized by an R-C combination. For the line itself it holds good that both variables R, C are proportional to the length of the line, so that this delay varies as the square of the line length. When other elements are also involved in the R-C products, for example an external resistor or capacitor, the variation as a function of the line length becomes less steep. When all dimensions of a connection (length, width, thickness) are reduced by the same scale factor P, the switching times of the transistors are also often reduced by a factor P. The delay time of a line whose dimensions are also reduced by a factor P is usually approximately constant. It follows therefrom that the described problem concerning the delay introduced by the lines becomes more severe as the scale is further reduced. This problem is further intensified in that the number of transistors and other elements in a single integrated circuit continually increases together with the reduction of the scale. Actually, the dimensions of customary circuits remain substantially constant when measured in millimeters. However, an increasingly more complex function may be fulfilled by those newer circuits. Consequently, the problem imposed by the delay in the connection lines becomes even more severe. When the length (in millimeters) is constant, the delay time is increased by a factor $P^2$ in the case of a change of scale (width, thickness). The packing density of the gates is increased by a factor $P^2$. The ratio of the delay time via a general connection and a gate time is thus increased by a factor $P^2$. It has been found that the size of an isochronous region (calculated in gates) should decrease comparatively slowly when the scale factor is reduced. When the scale is sufficiently large, therefore, there is no need for subdivision.

Figure 1:
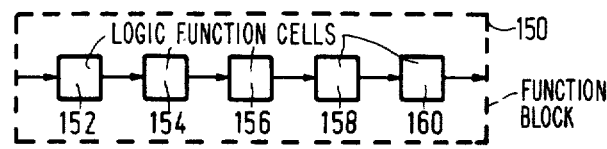
FIG. 1 illustrates an isochronous region.

FIG. 1 illustratse an isochronous region which is bounded by an interrupted line 150. This region comprises a number of logic functions 152 to 160 which are connected in a chain: the next function can be operative only after the preceding function has outputted its result. In the contemporary MOS process, the delay time in a gate function is typically in the order of magnitude of 5 ns. When such gates are arranged in direct succession, the delay time via the connections between the gate functions shown is small, for example in the order of magnitude of 1 ns. A clock frequency which is admissible for the circuit shown is then, for example 30 MHz. In practice a somewhat lower frequency is chosen when other delay times which have to be taken into account are not much smaller than 30 ns. The elements 152-160 are to be considered as "function cells" and together they form a "function block". The communication cells for connection to function cells in other isochronous regions will be described in detail hereinafter.

Figure 2:
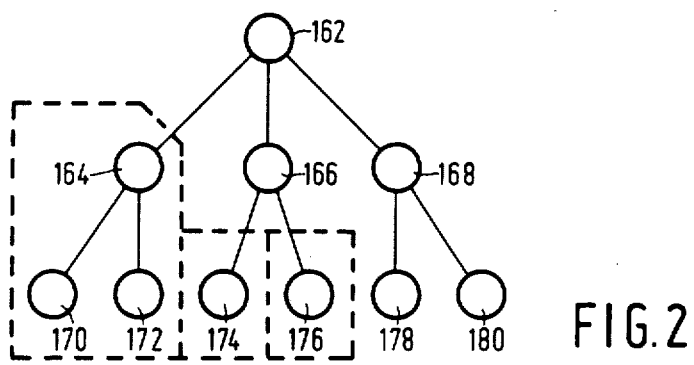
FIG. 2 illustrates the sub-division of an integrated circuit into several isochronous regions.

FIG. 2 illustrates the subdivision of an integrated circuit into several isochronous regions. The circle 162 represents the entire function to be performed in the circuit, for example "microprocessor". This function is subdivided into three-functions, for example: data path, control path and input/output operation, which are symbolized by the circles 166, 164, 168, respectively. The data path 166 (function) is subdivided by way of circles 174 (ALU) and 176 (RAM). The control path 164 is subdivided by way of circles 170 (control ROM) and 172 (program counter and the like). Broken lines indicate that the control path is located within a single isochronous region and that the data path is distributed between two isochronous regions. The input/output operation can also be distributed between several isochronous regions in different ways. Which function cells are paired between the relevant isochronous regions depends on the operations to be performed; however, microprocessors subdivided into several function cells/blocks are known per se, although without synchronization handshake between the various isochronous regions.

Many different possibilities exist as regards synchronization handshake, a number of which are described in the article by K. L. Thurber, A Systematic Approach to the Design of Digital Bussing Structures, Proceedings AFIPS Conf. Fall 1972, pp. 719–740; another possibility is described, for example in U.S. Pat. No. 4,357,658. The number of synchronization connections between two mutually paired function blocks usually equals at least two, but the information transport speed and/or the reliability can often be increased by using a larger number. For each connection there is usually provided a separate physical carrier, but this is not an absolute requirement.

EMBODIMENTS

The Composition of an Isochronous Region

Figure 3:
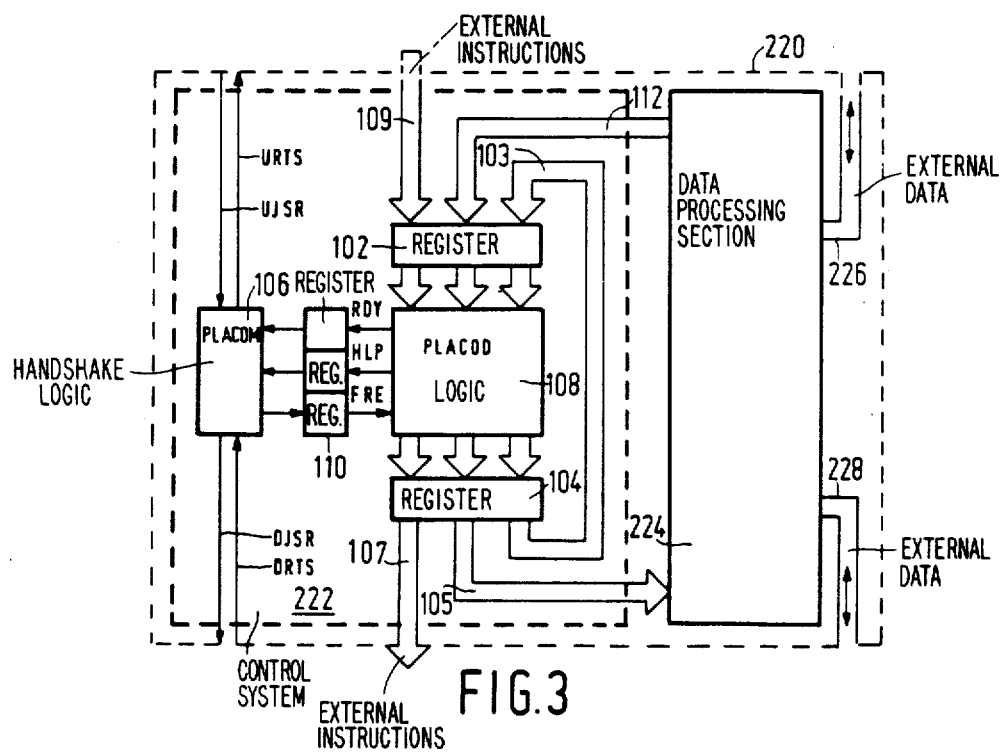
FIG. 3 shows an example of a circuit which can be realized within a single isochronous region.

FIG. 3 shows an example of a circuit formed in a single isochronous region 220. Therein, the function block 222 comprises the control system and function block 224 the actual operation/processing. First the control will be described. In the present embodiment, control is effected via programmable logic arrays (PLA) 106, 108 and registers 102, 104, 110. In another embodiment, a control unit can be formed by a number of flipflops without using programmable logic arrays. The PLA 106 provides the synchronization handshake with other function blocks in other isochronous regions. This use of a PLA has been found quite advantageous. The signals URTS/UJSR are transported at the top and the signals DRTS/DJSR at the bottom. Their designation is as follows:

DRTS: return from subroutine of subsequent PLA structure.
DJSR: jump to subroutine (to subsequent PLA structure).
URTS/SJSR: ditto with respect to a preceding PLA structure.

The signal directions "top/bottom" are always opposed. Between the selections PLACOM and PLACOD internally operated trigger circuits 10 are provided. The signal FRE(E) activates the code section and the signals R(EA)DY and H(E)LP activate the communication section 106. The output signals formed by the code section 108 are determined by the function implemented. It is known per se to realize a sequencer by means of a programmable logic array; therefore, the content of PLACOD will not be elaborated upon herein. RDY and HLP initiate communication with a subsequent PLA; RDY and $\overline{HLP}$ (inverted value of HLP) do so with a preceding array. The register 102 receives external instruction signals from another isochronous region on input 109 (arbitrary bit width), signals from the data processing section on input (inputs) 112, and internal state signals INTSTATE from the register 104 via line (lines) 103. In addition to these signals INTSTATE, the register outputs external instruction signals on output (outputs) 107 for another isochronous region and signals for the data processing section on line (lines) 105. The signals RDY (ready) and HLP (help) are also generated by PLA 108 as output signals.

The section 224 comprises the data processing section which is also referred to as "data path" as opposed to the term "control path" for the remaining section (108, 106 and others). This may be, for example an arithmetic and logic unit ALU, a register bank or stack, or an input/output element for connection to the environment. Via two data connections 226, 228, the section 224 is connected to a preceding and a subsequent structure, respectively. As in indicated, the connections 226, 228 are bidirectionally conductive, but that is not a requirement, This completes the description of FIG. 3.

Figure 4:
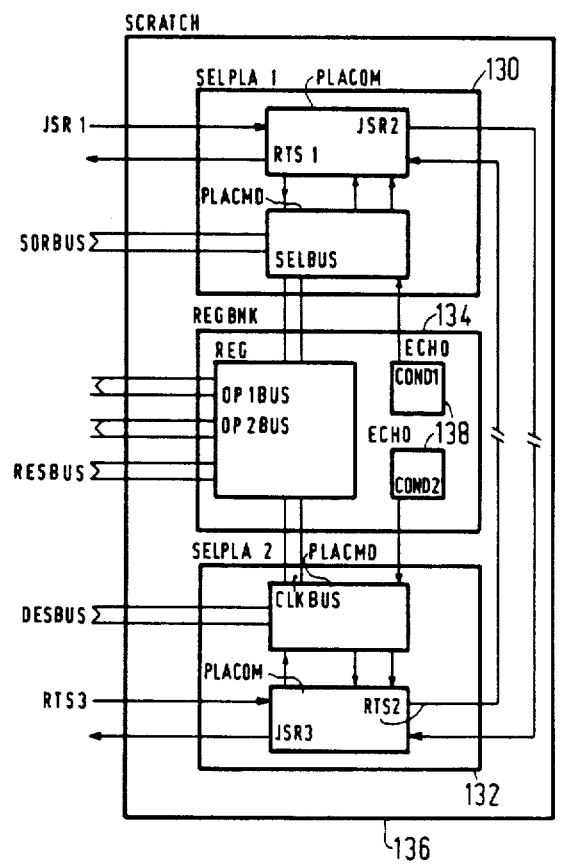
FIG. 4 shows a more complicated building block which comprises two control function blocks.

FIG. 4 shows a more complicated function block which comprises two control function cells and which is accommodated as one unit in a single isochronous region 136. Processing cell 134 is now formed by a register bank REGBNK. The control function cells are of the type described with reference to FIG. 3. They are shown in slightly simplified form. Via the source bus SORBUS, it is indicated which of the registers is to be connected to output bus OP2BUS. Via the destination bus DESBUS, it is indicated which register is to be filled with data from result bus RESBUS. The synchronization handshakes are provided by a pair of lines JSR/RTS (1, 3). Furthermore, the output OP1BUS is available as an output of an accumulator register in this embodiment. The echo elements 138 provide a half-synchronization handshake between the three sections 130, 132, 134. The lines SEL(ECTION)BUS and CL(OC)KBUS form the control lines therebetween. Such a "half handshake" will not be described here for the sake of brevity.

Cutting of the lines JSR2, RTS2 would allow for the connection therebetween of an ALU to perform operations on the information from one of the operand busses OP(1, 2)BUS, after connection of the register indicated by SORBUS to the other operand bus. After this operation, the input bus RESBUS is connected to the second register in order to store the result of the operation therein (Selected by DESBUS).

Figure 5:
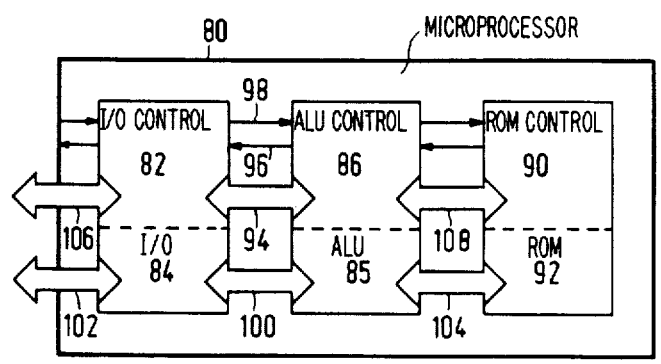
FIG. 5 shows a simple microprocessor subdivided into three isochronous regions.

FIG. 5 shows a simple microprocessor subdivided into three isochronous regions; a microprocessor may be divided into more isochronous regions per se; however, this will depend on the complexity, on the number of functions, and on the restrictions imposed by the relationship between clock frequency and delay time of signals in the circuit. The right-hand section of FIG. 5 comprises a read-only program memory 92 and a control section 90 for this memory. The central section comprises an arithmetic and logic unit (ALU) 85 as well as an associated control section (86). The left-hand section comprises an input/output unit 84 and an associated control section 82. In this case there are three function cells, each of which is a function block and is situated in its own isochronous region. The three function blocks are each time paired two-by-two by way of data lines 100, 104, control lines 94, 108 and synchronization lines such as 96, 98. The bond pads of the very large scale integrated circuit 80 have been omitted for the sake of simplicity. For the design of a more elaborate circuit, preferably a description per building block is provided at a high abstraction level. For example, for the design of a circuit the function cells can be specified by way of the function to be defined in the form of parameters, for example, by way of the width of the data path, stack height, and the selected set of instructions. The correct design for the relevant function block is then selected by means of a known library selection mechanism. Such library mechanisms where the shape of a switching element is fetched by specifying a function to be performed by the relevant switching element are customarily used in computer-aided design systems (CAD) for integrated circuits.

In addition to the described possibilities for the function blocks, numerous other possibilities exist, some of which will be described hereinafter, together with the associated control functions.

a. Memory, with function decoders, address decoders, adaptation to the data path, refresh organization, and additional registers.
b. ALU, with control decoders, function generators, registers and so on.
c. I/O unit, with at least a few registers (at least one for each direction), function decoder, input/output, read/write possibly programmable, and provided with address encoding and/or decoding means).
d. Register bank or register stack with pointer decoding and function decoding.
e. Timer, possibly programmable.

The control unit in its isochronous region presents instructions to the data path and tests given conditions thereof. In a preferred embodiment, this control unit can be constructed substantially as shown in FIG. 3.

Figure 6:
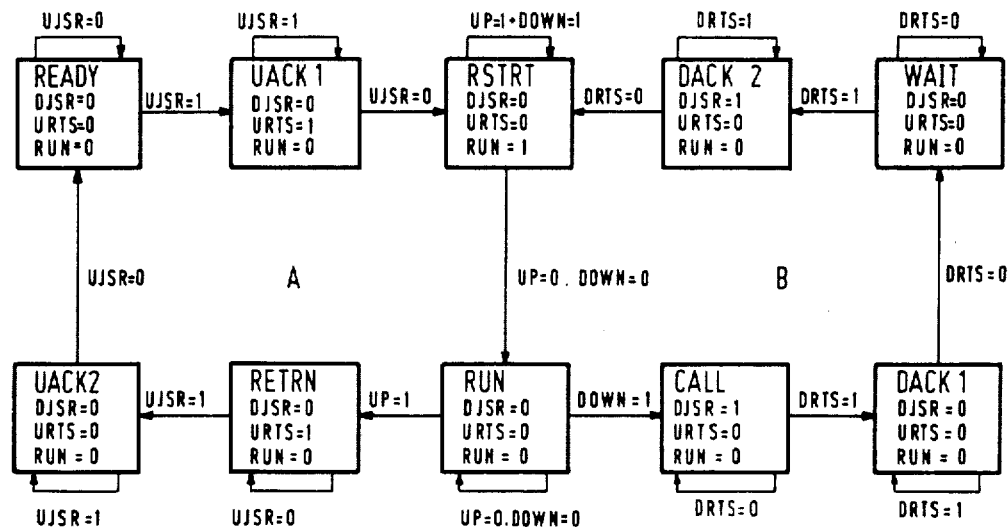
FIG. 6 shows a synchronization handshake mechanism via which a function block can communicate with two other function blocks.

FIG. 6 shows an associated synchronization mechanism in the form of a state diagram which comprises two double synchronization handshakes: at A as regards the next-higher function block, at B as regards the next-lower function block. Furthermore, there is provided a single synchronization handshake which refers to the block PLACMD by way of the signals RUN and (UP or DOWN).

The information to be transferred is validated before the associated validation signal (U/D)JSR becomes high. In a double synchronization handshake, subsequently the signal (U/D)RTS is used as an acknowledge signal. For the positioning on the chip, function blocks which often communicate with one another are preferably arranged near one another. If this is not done, no errors would occur but the circuit as a whole would operate more slowly due to the waiting times required for the completion of the relevant information transport; the operations which can be quickly performed are indeed quickly performed, but the operations which must by necessity be performed more slowly, are also performed more slowly (in this context "operation" is to be understood to include also the necessary information transport). The "multiplicity" of an information transport between two predetermined function blocks per se may depend on the type of operations to be performed by the entire integrated circuit. Due to different fields of use certain operations may vary in occurrence frequency among several items of the same circuit type or for a single item vary as a function of time. In addition to the already described signals, the following designations can be given:

| | | | |
|---|---|---|---|
| READY = | ready | DACK1 = | Down ACKnowledge 1 |
| UACK1 = | Up ACKnowledge 1 | | |
| RSTRT = | ReStaRT | WAIT = | WAIT |
| RUN = | RUN | DACK2 = | Down ACKnowlegde 2 |
| CALL = | CALL | RETRN = | RETuRN |
| | | UACK2 = | Up ACKnowledge 2. |

Figure 7:
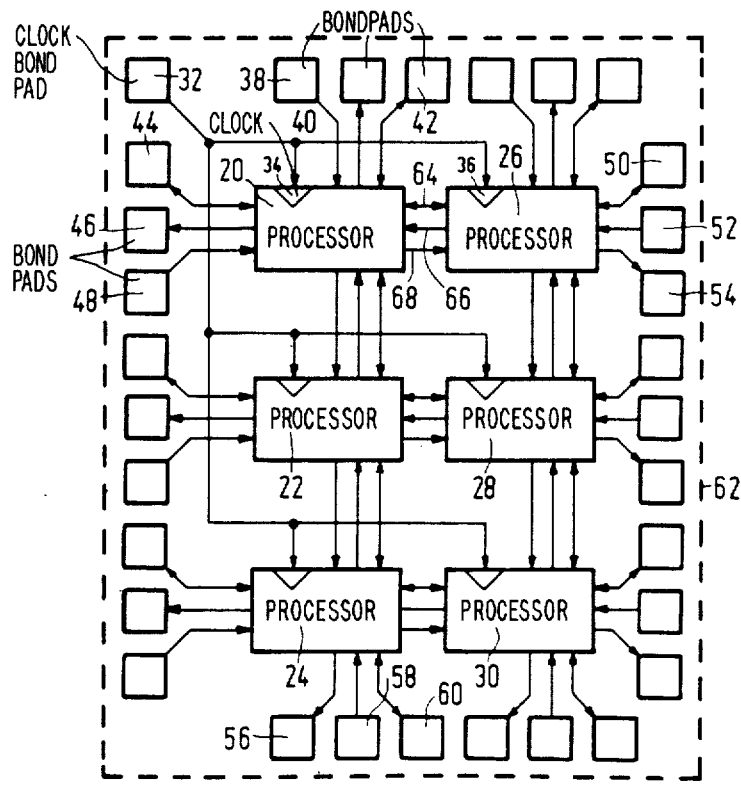
FIG. 7 shows a matrix of processors, each of which constitutes an isochronous region.

FIG. 7 shows an integrated circuit which comprises a matrix of processors, each of which forms an isochronous region. Several hierarchic levels are possible per se; some processors may be divided into several isochronous regions while others are not. Within the boundaries of the electronic circuit which are denoted by broken lines are situated six processors 20, 22, 24, 26, 28, 30, each of which comprises an arithmetic and logic unit (ALU), a program memory for control information special (dedicated) logic, a read/write memory for intermediate (data/address) information, control decoding, elements for input/output of information from and to the environment, and a bus for data, address, and control information which bus interconnects the other elements. These elements are not shown in detail. The processor 20 also comprises a clock element 34, the processor 26 comprising a clock element 36, and so on for the other processors. There are seven pairs of processors, that is to say 20/26, 20/22, 26/28, 22/28, 22/24, 28/30 and 24/30. By way of example, however, only the pair 20/26 will be described in detail. These processors are interconnected by a bidirectional data line 64, a handshake line 66 in a first direction, and a handshake line 68 in a second direction. These lines are shown as a single line, but the data widths may have any value; in certain embodiments, the data paths may have different widths; for example, horizontal connections could have a width different from vertical connections. A certain data line may have a width of 8 bits and be operational in simplex, half-duplex or full duplex mode. The handshake lines may be single or multiple; as in the present case, they can conduct handshake signals in one direction or alternatively in both directions. The handshake protocol will be described in detail hereinafter. Using data and handshake connections, the processor 20 is connected, similar to the processor 26, to the bond pads 44, 46, 48 (to the west) and to bond pads 38, 40, 42 (to the north). Similarly, the processor 26 is connected to bond pads 50, 52, 54 (to the east) and the processor 24 is connected to bond pads 56, 58, 60 (to the south). This single integrated circuit can thus be connected to a further such circuit. The master clock signals arrive on the bond pads 32 from an external clock and are distributed between all processors. Each processor receives its own, unconditional clock signals from its own local clock element which is synchronized by the master clock signals. The handshake signals are locally synchronized with the master clock in order to quantize the time. The the asynchronous nature of the handshaking is thus maintained because the processors must wait for one another. Thus, the clock signals are not unconditional as regards the handshake because each data (address, control) transport such as that via the line 64 is accompanied by mutual signalling. Due to the handshake nature, for example a transport request signal must always precede a transport acknowledge signal. The handshake can also be effected without such quantizing of time; in that case it is also asynchronous at the "micro level". The circuit of FIG. 7 is subdivided into six isochronous regions which are in first instance equivalent. When all connections are singular, and two power supply connections are also counted, this circuit comprises at least 33 bond pads in the embodiment shown. The bond pads can be externally interconnected, for example 44 to 50 (data), 46 to 52/48 to 54 (handshake signals in two directions). On the other hand, it may sometimes be advantageous to limit the number of bond pads so that not all peripheral processors can communicate with the environment but only processors which are situated along one of the long sides. When the data paths have a width of several bits, as has already been stated, only a limited selection of the data paths can then be directly connected to the bond pads. A solution in this respect may be the use of (de)-multiplexers which can be included in a function block reserved for this purpose; the latter block will again be formed in a separate isochronous region.

Figure 8:
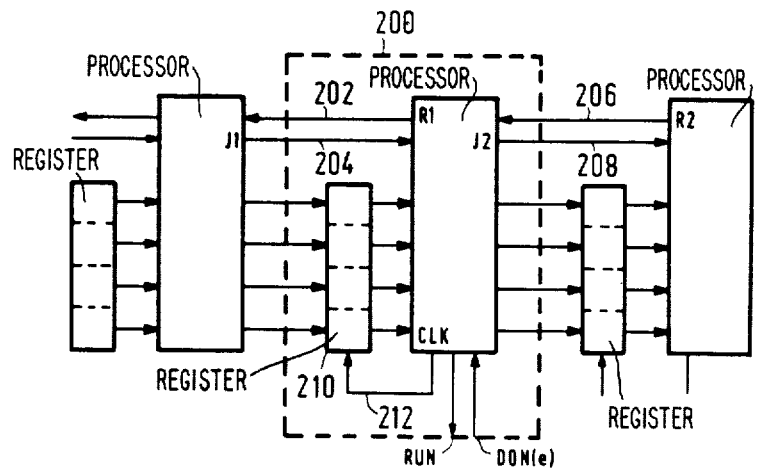
FIG. 8 shows a pipeline processor subdivided into several isochronous regions.
Figure 9:
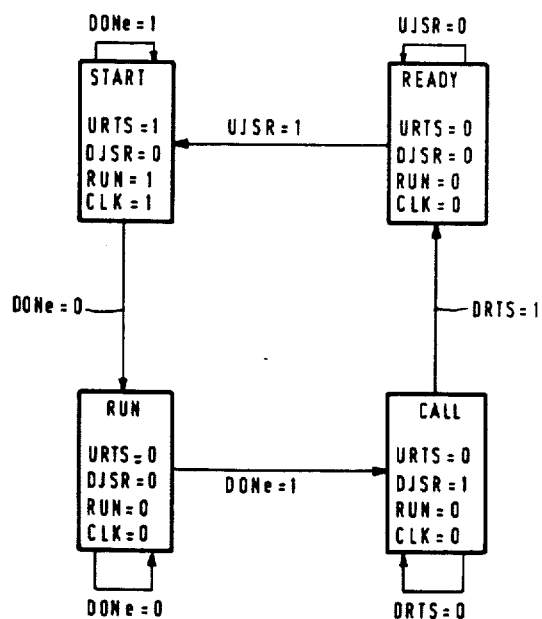
FIG. 9 shows a synchronization handshake mechanism for FIG. 8.

FIG. 8 shows a pipeline processor subdivided into several isochronous regions; FIG. 9 shows the associated handshake mechanism. Such a pipeline processor also involves parallel processing of the information. The Figure shows three successive stages, only one of which will be described in detail (shown within block 200). Each stage is formed in a separate isochronous region. The block has two communication lines available for communication with the preceding block (202/204) and with the subsequent block (206/208). Also provided is a register 210 (in this case shown as having a width of four bits) for the storage of the information arriving from the preceding block by way of a clock signal CLK on line 212. The communication unit of the block (not separately shown) can assume one of the following four states:

1. Ready: the unit has transmitted data to the next block and now awaits new data to be processed from the preceding block;
2. start: the unit has received data from the preceding block, and acknowledges reception; this data is also clocked into the new register 210 and the instruction elements of the block are instructed to process the data;
3. run: the unit waits until the instruction elements have processed the data;
4. call: the unit despatches a message to the next block, thus informing this block that data has been made available for this block; the unit then waits for acknowledgement by the latter block.

In the state diagram of FIG. 9 the communication takes place via single-sided handshakes. FIG. 6 required a double handshake because the handshake cycle therein may be terminated only after the information to be transferred has been validated; this is not a requirement in FIG. 9. Consequently, four acknowledge states are superfluous in FIG. 9: the communication mechanism does not wait until the next function block is ready, so that the state "WAIT" is superfluous.

The state "RETURN" is thus included in the "start" state. When the data has been processed, communication can take place only with the directly subsequent unit.

DESCRIPTION OF A METHOD AND A DEVICE FOR DISTRIBUTED TESTING

As has already been described, the various isochronous regions are isolated in the time domain. Therefore, the entire integrated circuit can be tested by the testing of all function blocks separately. However, some special facilities are required for this purpose. First of all, some examples will be described where the isochronous regions/function blocks are connected in a chain. Each of the blocks in the FIGS. 10a–10e represents an isochronous region each comprising a function block and communication cells for connection to other function blocks/isochronous regions.

Figures 10A, 10B, 10C, 10D, 10E:
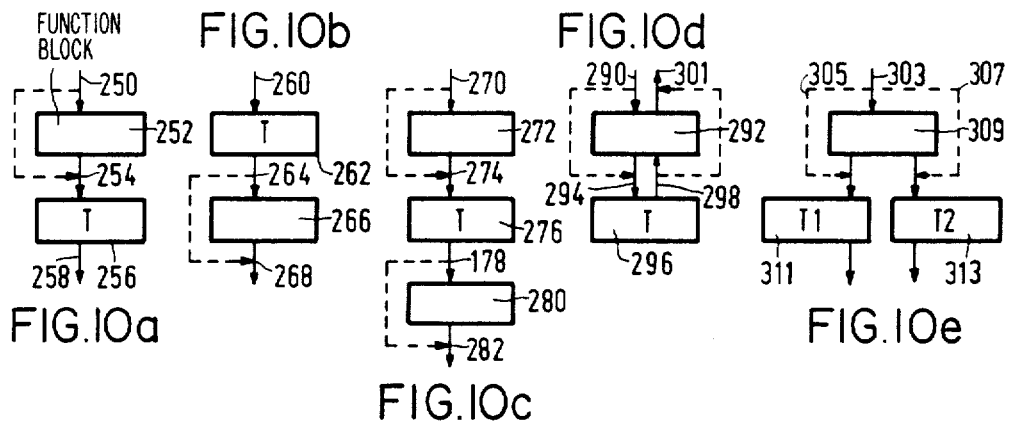
FIG. 10a-10e show elementary examples of distributed tests.

All information connections in FIG. 10a are unidirectional. The normal connections are denoted by non-interrupted lines. The handshake lines are not separately shown. The information arrives via line 250. Subsequently, it is processed in block 252 during which the information content may be modified. The processed information is applied to block 256 via line 254; the information may then be further modified. Subsequently, the information is outputted via line 258, for example to a user. In the test situation for block 256, the interrupted line is activated; this means that the test pattern on the line 254 corresponds bit-by-bit to the test pattern on the line 250 because the interrupted line bypasses the block 252.

FIG. 10b shows an embodiment which differs from that of FIG. 10a. The test patterns can now be received directly from the environment in the block 262 to be tested. The result patterns are outputted via block 266. In the test state, the connection which is denoted by an interrupted line is activated so that the information cannot be modified in block 266 and the result patterns appear bit-by-bit on output line 268. Bit-by-bit is to be understood to mean herein that a bit of the original pattern can be derived from each bit of the output result. This might involve recoding bitwise, for example "invert all bits".

In the set-up shown in FIG. 10c, the block 276 to be tested communicates directly with the environment neither at the input nor at the output; each time a further block (272 and 280, respectively) is inserted. Therefore, in the test state both interrupted lines are activated, so that the blocks 272, 280 do not influence the test pattern and the result pattern.

In the set-up shown in FIG. 10d, the block 296 to be tested is bidirectionally connected to the block 292 which is the only block connected to the environment. Therefore, in the test situation both interrupted lines are activated so that the block 292 does not affect the test pattern and the result pattern. In some cases it may occur that given function blocks cannot modify information, for example in that they are constructed as a register stack. In that case it may sometimes be superfluous to include a bypass line.

The set-up shown in FIG. 10e comprises two blocks 311, 313 to be tested which both receive information from block 309. For the testing of the block 311, the interrupted line 305 is activated in order to apply test patterns bit-by-bit directly to the block 310. Similarly, for the testing of the block 313 the line 307 is activated.

Figure 11:
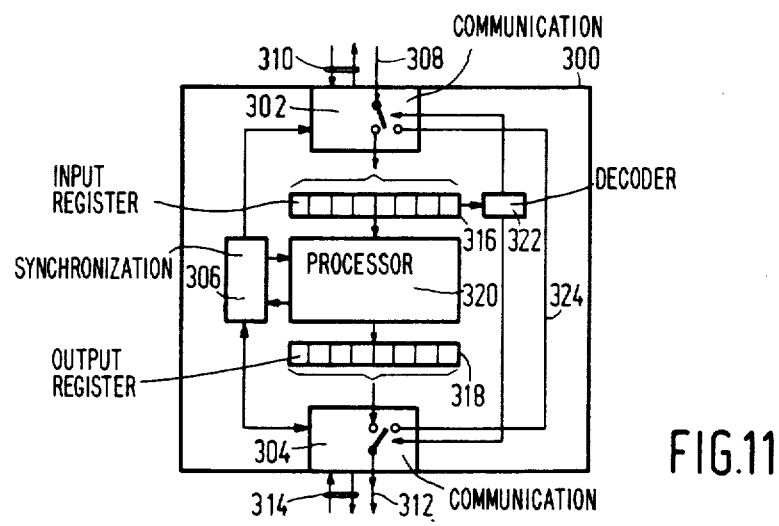
FIG. 11 shows an isochronous region comprising communication cells organized in a multiplexed manner.

FIG. 11 shows an isochronous region comprising communication cells which are organized in a multiplexed manner. The isochronous region covers the rectangle 300. Communication cell 302 receives information via line 308 and executes a bidirectional handshake protocol via lines 310. Communication cell 304 dispatches information via line 312 by way of a handshake protocol via lines 314. In the present embodiment, the communication cells both comprise a two-way switch having a first position and a second position. In the first position, the line 308 is connected to input register 316 and output register 318 is connected to the line 312. Under the influence of the interaction with the handshake signals received from the communication cells in the synchronization function block 306 and the output of handshake signals by said synchronization function block, the registers 316, 318 are correctly filled/vacated and the processing function block 320 executes (internally isochronously) the operations which are typical of the function block but which, however, are irrelevant in this context. Element 322 is a decoder which is activated in response to a given input signal pattern. Alternatively, the element 322 may be a receiver for a specific test control signal which appears on a designated connection pin of the packages of the integrated circuit; however, such a test control signal has been omitted for the sake of simplicity. When this test control signal or the specified input signal patterns appear, said two-way switches assume their second position and the information received on the line 308 is outputted again directly on the line 312 via line 324, without it being possible to perform an information-modifying operation. The switch can be reset either after a given period of time or after a number of test patterns (when element 306 comprises a counter), or simply by the disappearance of the test control signal. By cooperation with the external test control signal and specific code words in the various input registers, different chains of bypassed function blocks can be formed. In another embodiment, only the outgoing communication cell 304 comprises a two-way switch, in that case test patterns and result patterns are processed, but any modifications introduced are not externally visible. Alternatively, only the communication cell 302 comprises a multi-position switch at its input, notably when the processing circuit 320 still outputs the same information, which is masked by the test patterns received via the line 324 (like an open-collector connection). In the set-up of FIG. 10e, this input may then comprise a tristate switch. In the case of a plurality of inputs and a single output, the multi-position switch can be connected to the output, together with various bypasses for the various inputs. In the set-up shown in FIG. 10c, first the blocks 272, 276 are disconnecged by a first control word, and block 280 is tested. When block 280 has been found to be "correct", two possibilities exist:

(a) first the block 280 is disconnected under control of the last test word. Subsequently, the block 272 is disconnected by the second control word. The second control word and the last test word may be the same. When the block 276 has been found to be "correct", it is disconnected by the last test word of its own series. Subsequently, the block 272 is tested. The test is terminated by termination of the external test control signal.

(b) when the block 280 does not comprise a memory, which means that the result at the test word (n+1) is independent of the previously presented test words, the block 280 need no longer be disconnected when it has been found to be correct. In that case only (n−1) control words will be required for n function blocks. It will be apparent that in such a case the result word is determined by the function to be tested in the relevant function block and also by the (correct) function (functions) in a subsequent function block (function blocks).

In the case of a bus, the function blocks connected thereto can be selectively activated by addressing.

Figure 12:
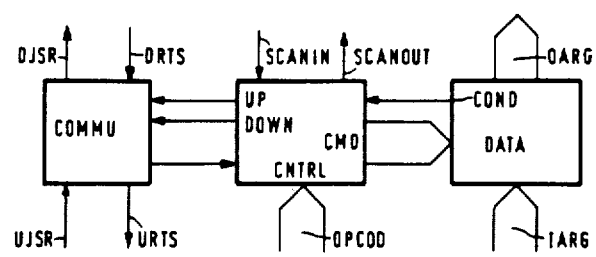
FIG. 12 shows an isochronous region with information connection means for test patterns/result patterns.

Another method of distributed testing will be described with reference to FIG. 12 which shows an isochronous region comprising information connection means for test patterns/result patterns. The set-up of the circuit corresponds substantially to that shown in FIG. 3 and includes a communication section COMMU, a control section CNTRL, and a processing section DATA. The control section receives the OPCODES and the processing section receives input data IARG and outputs output data OARG. Processing is performed by control signals CMD, possibly cocontrolled by a condition signal COND. The relevant isochronous region forms part of a circuit comprising several isochronous regions. The control section CNTRL is connected to a line SCANIN for receiving a test pattern; the actual intake of this pattern is controlled by a test command on line OPCOD. A result pattern is subsequently outputted on the line SCANOUT; if desired, this can be performed under the control of a second test command on the line OPCOD. The lines SCANIN and SCANOUT are connected to a test circuit which may form part of the integrated circuit. The test circuit tests the result patterns for concordance with the associated test patterns. It is connected to the various lines SCANIN/SCANOUT via a (de)multiplexer structure and comprises an output which is connected to the environment for indication of the various states: test, non-test, correct, incorrect. Alternatively, the test circuit need not form part of the integrated circuit; in that case only the (de)multiplexer structure is provided on the chip. The lines SCANIN/SCANOUT may be single. In a preferred embodiment, the circuit is tested so that each time only one isochronous region is active. This can be very simply achieved by the introduction of the handshake mechanism between different isochronous regions. In that case only one isochronous region will accept a test pattern at any instant, so that the lines SCANIN can be connected in parallel to all isochronous regions to be tested. Similarly, the lines SCANOUT can then also be connected in parallel to all isochronous regions to be tested. The (de)multiplexer structure for the test circuit can then also be omitted. The number of test connections can be further reduced as follows:

(a) the test pattern is not applied to the isochronous region from outside, but is generated within said isochronous region itself, for example by means of an end-around coupled "maximum length" shift register. The result can also be processed by means of such an end-around coupled shift register; the result pattern then exhibits the characteristics of a so-called "signature" pattern. When this pattern comprises, for example 16 bits, only 1 of the $2^{16}$ possibilities is a correct pattern, the other patterns indicating an incorrect operation. In that case the risk that an error does not become manifest as an incorrect result pattern is approximately $2^{-16}$; in many cases such a risk is acceptable.

(b) the lines SCANIN and SCANOUT are combined; in that case a bidirectionally activatable transmitter/receiver circuit will be required in the relevant isochronous region (and also in the test circuit).

THE DESIGN OF AN INTEGRATED CIRCUIT OF THE DESCRIBED KIND

Figure 13:
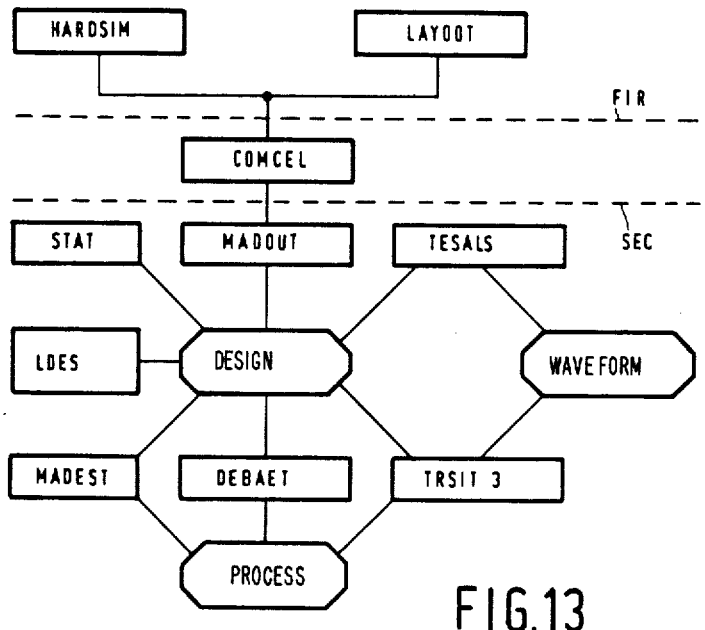
FIG. 13 shows an organization diagram for the design of an integrated circuit as described above.

FIG. 13 shows an organization diagram for the design of an integrated circuit of the described kind. This organization diagram shows the various program constituents (programs and data files) of the design system as well as their functional interactions. A description will first be given of the parts which enable the design of an integrated circuit without using communication cells. The block HARDSIM is a program written in the programming language SIMULA for the functions to be performed by the circuit and also includes a number of auxiliary procedures whereby a number of elementary parts can be addressed ina simple manner, for example "cell", "signal", "input", "output". The elements of this block are adequate for a description of the behavior and the structure of the integrated circuit. This has already been published in the article "FULLES, a VLSI programming environment", by L. Spaanenburg et al., Digest CICC '83, pp. 456–460, Rochester, N.Y., May 1983. The block HARDSIM produces a result (in reaction to the input of the function specifications by a designer) in the form of a number of data files. In cooperation with the block HARDSIM, the block layout contains a structure which has also been published in said article and which produces a geometry for the circuit described in SIMULA by means of an internal data file structure of said block LAYOUT. The part of the organization diagram which is situated above the interrupted line FIRCST) thus offers a large-scale and structural description of the function blocks. Thus, according to such a "top-down" approach first the general function is specified, the program thus predicting on the basis of predetermined rules functions which are not specified in the function description. The design will usually be performed in a number of operations, successive operations requiring the input of a more detailed description of the behavior for the more general description of behavior introduced during the preceding operations. The prediction, of course, may also involve the formation of incorrect sub-functions which also require correction during a next operation. Said article defines the following successive elements as from the lowest level (bottom-up):
elementary conductor blocks;
cross-contacts of conductors (same layer, different layers with contacting through, different layers with electrically inactive separating-isolating (cross-over), different layers with electrically active separating-isolating layers - transistors);
components, for example transistor (vertical or lateral);
mask as a set of elements such as transistors and the like;
gates, for example in dependence of a variety of procedures.
In the section below the line SEC(OND), the principal data files are indicated as octagons; the other elements, notably programs, are indicated as rectangles. The central block DESING forms a design data file having the internally defined format of the logic diagram. The block MADOUT which is situated thereabove interprets the data file of the block DESING and forms a conversion program. Conversion may be omitted in given cases, depending on the definition structure of the block DESING. It is to be noted that the contribution of the designer consists of the selection of the data which are applied in SIMULA language; the remainder above the line FIR and below the line SEC is then casually determined and executed in accordance with the state of the art. Each section of a circuit has two aspects, that is to say a volume and an edge. For each of these aspects the file DESING comprises two sub-files, one containing a structure description and one containing a behavior description: all in all four sub-files are present. As has already been stated, there are a number of layers which each comprise their own circuit segments. The structure description always provides an answer to questions: where is what?; the behavior description answers questions: what does what do? A logic description is now formed at the expression level of the integrated circuit by the block DESING.

The block PROCESS comprises a data file which concerns the specific properties of the technology to be used. The block WAVEFORM comprises a data file concerning the waveforms of the input signals.

The block TESALS comprises a program which performs a simulation of the various gates by way of the logic description (block DESING) and the waveforms of the input data; from this simulation, a result "correct" or "dubious" can be derived as evaluated by the designer. From this known simulation, it may be deduced, for example that a "race" condition may exist in the circuit, because two input signals of a logic gate would change simultaneously, which would cause brief, logically undefined intermediate states on the output. Should such an error occur, a rejection is signalled and the design must be changed or the input data must be modified. In accordance with the known system, such an error would have consequences at all levels of the design procedure, notably also in the parts above the line FIR. The block TRSIT3 comprises a program developed and marketed by "Leuven Research and Development Corporation" of the Univ. of Leuven, Belgium. Using the logic functions to be formed by the block DESING, the technology data from the block PROCEES, the waveform data from the block WAVEFORM, and the geometry of the various transistors, this block TRSIT3 performs a simulation at the transistor level which is similar to that performed at the gate level in the block TESALS. In given circumstances conflicts may then arise as regards electrical specifications of these transistors (for example, power, impedance or speed). The block DEBAET comprises an assembly program which performs, on the basis of the logic functions to be formed from the block DESIGN and the technolgoy data from the block PROCESS, a conversion between cell names and mask descriptions, for example, in the form of a connecting series of rectangles per mask. Subsequently, these mask data are returned to the data file in the block DESING.

The blocks STAT, LDES and MADEST notably concern the interaction with the operator or the designer. The block STAT contains a program which forms, using the state diagrams from the block DESING, a gate diagram in the form of a description with Boolean formulae. Therefrom, a list-like display can be selectively produced on a video monitor or another medium such as a printer. Interaction with the operator can take place by way of selective addressing of the list for the dipslay of a predetermined part. When a modification is to be made, it must be introduced elsewhere in the design, for example by adaptation of the signal generator (block WAVEFORM), modification of the function (block HARDSIM), or addition of buffer stages (block LDES). Like the block STAT, the block LDES also operates on the basis of behavior descriptions. It contains a program which is capable of forming a list-like display of the gate description from the block DESIGN on a CRT or other medium, for example as a list of gates, together with a list of the other gates connected to each input of each gate or each output of each gate. This list, moreover, comprises a sublist of other elementary elements defined at the gate level, for example converters for voltage levels and bistable elements of various types. Again a part of the list can be displayed on a CRT device by selective addressing; any corrections thus indicated can be made in one of the other blocks. It is also to be noted that the block DESIGN comprises a library of cells described at different abstraction levels; this library can be addressed at these various levels. The data file block DESING also contains inter alia the data for the block COMCEL to be described hereinafter. The block MADEST contains a program which acts on the structure description of the transistors introduced from the block DESING and which can produce, using technology data from the block PROCEES, a list-like display of the standard transistors to be used, together with the associated positions and orientations, or a list of mask angle coordinates of the relevant masks, on a video monitor or another medium. Subsequently, an operator can perform a selective addressing operation in order to display a sub-list of this list.

Moreover, a graphic display element can be connected to the block MADEST in order to form an image by selective addressing of the relevant lists (by list number or otherwise) with the geometrical coordinates associated with the various list numbers. This image consists of rectangles and a simple algorithm determines whether a pixel is situated within a given rectangle, for example a transistor part, or outside such a rectangle. Such algorithms have been previously described. Furthermore, each time a given class of polygons (for example, a diffusion polygon or a flipflop) is displayed in a given, designated color. It is known to use, for example, 64 different, transparent or solid colors.

In accordance with the known state of the art, the section which is situated above the line FIR is directly connected to the sections below the line SEC. This has consequences in the sense that a fault, error or modification in the lower section, or in the operation of this section, has consequences for all parts, and hence also for the input (parameters, functions) in the blocks HARDSIM and LAYOUT. In given circumstances this may necessitate a large number of reprocessing operations. According to the aspect of the invention which is relevant for the design, the part of the organization diagram which situated below the line SEC via an intermediate block COMCEL. The block COMCEL contains a program which provides function blocks generated in the upper part with pair-wise associated communication cells on their pair-wise connecting communication lines. The structure and behavior descriptions of these cells may again be included in the data file of the block DESING. These communication cells may also be present in different form, for example in accordance with the structure and quantity of the communication (for example, unidirectional versus bidirectional communication, and also according to different bit widths). The already described reprocessing operations, therefore, need never be continued to the level of the interaction between the various function blocks: corrections and errors now have an effect only as far as the separating line SEC (at least in as far as they became manifest in the lower part of the design system).

Figure 14:
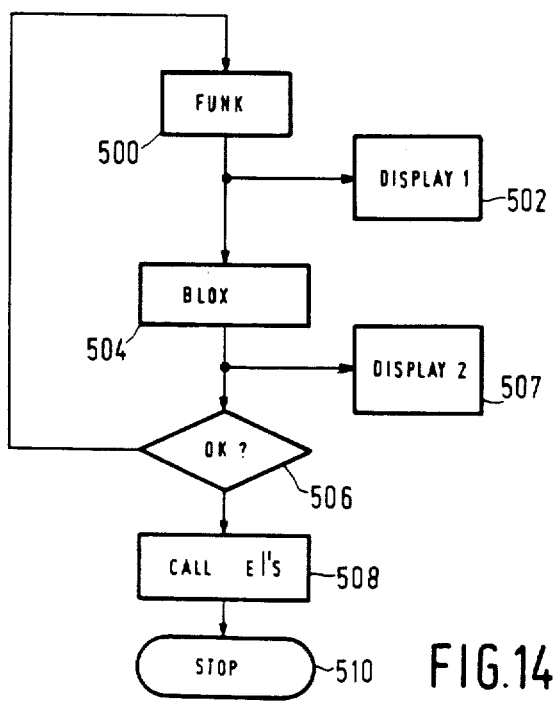
FIG. 14 shows a flowchart for the design of an integrated circuit as described above.

FIG. 14 shows a flow chart for the design of an integrated circuit of the described kind. Block 500 shows the composition of the list of the functions to be performed, possibly in parameter form. In block 502 this list is displayed, in a selected manner or not. In block 507 a list of function blocks is formed from the list of functions. This procedure can be performed in interactive operations. The display of the list of function blocks is realized in block 504. In block 506 it is decided whether the list of function blocks is correct. In block 508 the constituent shape elements are addressed for each block in order to be positioned in the isochronous region of the relevant function block. The testing and reprocessing within the separate function blocks is performed in a conventional manner without utilizing the interaction-isolating effect of the block COMCEL. This can be done in advance. Use is then made of a library comprising correct function blocks. After any reprocessing operations, the process is stopped in block 510. The integrated circuit can now be tested at more levels:
a. each separate function block is tested for correct operation as has been described above;
b. the entire circuit is tested for processing capacity. This is done by presenting a number of signals to be processed, for example a so-called benchmark test. Instead of correctness, the processing speed is now tested.

What is claimed is:

1. A very large scale integrated circuit comprising a plurality of function cells which are connected to one another and to the environment by means of information connections, wherein said function cells are grouped in a number of $m \geq 3$ function blocks, the integrated circuit which is formed on a single chip being subdivided into m isochronous regions, each of which comprises one function block, each isochronous region comprising for each information connection a communication cell between a function cell which is situated within the isochronous region and any function cell which is situated outside said isochronous region, said communication cell being connected in the relevant information connection so that any information connection between two function cells which are situated in different isochronous regions always comprises a series connection of two communication cells, two communications cells thus paired being interconnected by an information connection and at least two synchronization connections for by means of bidirectional handshake signals under local control realizing as asynchronous information transport between said paired communication cells, and therefore between the associated isochronous regions, each information connection from any function cell to the environment comprising a further communication cell for the exchange of information and synchronization signals with the environment, the function cells within a function block forming a coherent first network while the function blocks within the integrated circuit form a coherent second network.

2. An integrated circuit as claimed in claim 1, wherein at least two function blocks which are paired by way of intermediate communication cells both comprise processing function cells.

3. An integrated circuit as claimed in claim 1 or claim 2, wherein the connection between a first function block and a second function block comprises a first set of information lines, the connection between the first function block and a third information block comprises a second set of information lines, and said first and second set are different.

4. An integrated circuit as claimed in claim 3, wherein the numbers of information lines in said first and said second sets are different.

5. An integrated circuit as claimed in claim 4 wherein the number of data lines in said first and said second sets are different.

6. An integrated circuit as claimed in claims 1 or 2, wherein the information connection between an isochronous region and further function blocks comprises a register bank which can be selectively coupled to said further function blocks under the control of relevant control blocks.

7. An integrated circuit as claimed in claim 1, wherein at least three function cells which are situated in a corresponding number of mutually paired isochronous regions are connected by means of communication cells with intermediate information lines each of which is unidirectionally conductive in a direction from the directly preceding isochronous region to the directly subsequent isochronous region.

8. An integrated circuit as claimed in claims 1 or 2 comprising a microprocessor having at least a function block which performs arithmetic and logic functions, a memory function block and an input/output function block which comprises an information connection to the environment.

9. An integrated circuit as claimed in claim 1 or 2 comprising at least one isochronous region including means for supplying a test pattern or result pattern received from another isochronous region bit by bit to a third isochronous region when the integrated circuit is in a test state.

10. A method of testing an integrated circuit as claimed in claim 9 comprising the steps of:
  (a) setting the integrated circuit to a test state;
  (b) presenting a test pattern to a function block in order to form a result pattern from said test pattern while excluding information signals which can be received from other function blocks;
  (c) outputting said result pattern of said function block for bit-by-bit presentation to a test circuit;
  (d) repeating, if necessary, the steps (b) and (c) while using other test patterns;
  (e) verifying the result patterns for correctness until a reliability limit is reached or an error is detected;
  (f) repeating, if necessary, the steps (b) to (e) for further function blocks to be tested;
  (g) approving the complete integrated circuit on the basis of the reliability limits reached or rejecting the integrated circuit on the basis of the errors detected;
  (h) setting the integrated circuit to a ready state in the case of approval.

11. An integrated circuit as claimed in claims 1 or 2, comprising a function block to be tested which is connected to the connection to the environment via a group of further function blocks wherein said group forms a chain of function blocks for supplying test patterns to the function block to be tested or for outputting result patterns from the function block to be tested and in which each isochronous region whose function block is included in the chain comprises communication cells which are included in the chain, each of said communication cells having multiplexed first and second states, said first state for activating the associated function block and said second state for supplying a test pattern or result pattern received from a second isochronous region bit-by-bit to a third isochronous region.

12. An integrated circuit as claimed in claims 1 or 2, wherein at least one isochronous region comprises information connection means for communicating, in a test state of the integrated circuit, a result pattern of a test to a test circuit, said isochronous region otherwise comprising exclusively information connections to other isochronous regions.

13. An integrated circuit as claimed in claim 12 wherein said information connection means comprise a conductor which is common to several isochronous regions for outputting a result pattern.

14. An integrated circuit as claimed in claims 1 or 2, wherein at least one isochronous region comprises information connection means for communicating, in a test state of the integrated circuit, a test pattern and a result pattern produced by said test pattern to a test circuit, said isochronous region otherwise comprising exclusively information connections to other isochronous regions.

15. A method of designing a very large scale integrated circuit as claimed in claim 1 by means of a library of shape elements which define the behavior model of the associated function cells comprising the steps of:
  (a) describing the group of functions to be performed by the circuit with respect to the environment as a first list of functions which is to be displayed on a display element;
  (b) dividing said group into separate function blocks for display on a display element in the form of a second list;
  (c) defining a group of $m \geq 3$ isochronous regions, each of which consists of one function block, and also defining the interactions between different function cells in different function blocks in order to add a communication cell to each function cell within a function block having an information connection to a function cell which is situated outside the relevant function block, so that each information connection between two function cells which are situated in different isochronous regions comprises a series connection of a pair of communication cells, a communication cell comprising a shape element as a connection for an information connection and a synchronization handshake element with two synchronization handshake lines;
  (d) positioning the function blocks, communication cells, connecting information connections and synchronization handshake connections;
  (e) fetching the shape elements defined per function cell from the library.

16. A very large scale integrated circuit comprising a plurality of function cells for together executing a first set of digital data processing functions, said circuit being distributed over a plurality of at least three isochronous regions, in each of which any internal operation is independent of any signal delay time variation therein; each isochronous region comprising a second set of interconnected function cells together constituting a single function block; wherein a particular first function cell in a first isochronous region is connected by a first information connection with a particular second function cell in a second isochronous region, and a third function cell in said second isochronous region is connected by a second information connection with a particular fourth function cell in a third isochronous region, said first information connection having a first communication cell within said first isochronous region and a second communiation cell within a said second isochronous region, said second information connection having a third communication cell within said second isochronous region, and a fourth communication cell within said third isochronous region, wherein said first and second communication cells are interconnected by at least two handshake connections for bidirectionally transporting handshake signals for realizing under local control an asynchronous information transport between the associated communication cells, and wherein said third and fourth communication cells are interconnected by at least two further handshake connections for bidirectionally transporting further handshake signals for realizing under local control a further asynchronous information transport between the associated communication cell, and wherein at least one fifth function cell is provided with a fifth communication cell attached thereto, said fifth communication cell being provided with synchronizing means and at least one external handshake connection for realizing an exchange of synchronization and information signals with an external circuit connectable to said fifth communication cell.

* * * * *